United States Patent
Salama et al.

(10) Patent No.: US 7,471,532 B1
(45) Date of Patent: Dec. 30, 2008

(54) ELECTRIC CIRCUIT, IN PARTICULAR FOR A MEDIUM-VOLTAGE POWER CONVERTER

(75) Inventors: Samir Salama, Berlin (DE); Roland Jakob, Berlin (DE); Georg Beinhold, Berlin (DE)

(73) Assignee: Converteam GmbH, Berlin (DE)

( * ) Notice: Subject to any disclaimer, the term of this patent is extended or adjusted under 35 U.S.C. 154(b) by 0 days.

(21) Appl. No.: 10/048,799

(22) PCT Filed: Apr. 12, 2000

(86) PCT No.: PCT/EP00/03275

§ 371 (c)(1),
(2), (4) Date: May 1, 2002

(87) PCT Pub. No.: WO01/10007

PCT Pub. Date: Feb. 8, 2001

(30) Foreign Application Priority Data

Jul. 31, 1999 (DE) .................................. 199 36 117
Dec. 20, 1999 (DE) .................................. 199 61 382

(51) Int. Cl.
*H02M 7/5387* (2007.01)
(52) U.S. Cl. .............................. 363/98; 363/41; 363/132
(58) Field of Classification Search ................. 323/282, 323/283, 284; 363/41, 43, 98, 132
See application file for complete search history.

(56) References Cited

U.S. PATENT DOCUMENTS

| | | | |
|---|---|---|---|
| 5,088,017 A | | 2/1992 | Yaginuma et al. .............. 363/21 |
| 5,121,315 A | | 6/1992 | Moriya ......................... 363/65 |
| 5,155,675 A | * | 10/1992 | Maruyana et al. .............. 363/98 |
| 5,731,970 A | * | 3/1998 | Mori et al. .................... 363/132 |
| 5,910,892 A | * | 6/1999 | Lyons et al. ................... 363/98 |

(Continued)

FOREIGN PATENT DOCUMENTS

DE 196 30 284 A1 1/1998

(Continued)

OTHER PUBLICATIONS

S. Östlund; Influence of the control principle on a high-voltage inverter system for reduction of traction-transformer weight; pp. 110-115; Publication No. XP 000113877, no date.

(Continued)

*Primary Examiner*—Jessica Han
(74) *Attorney, Agent, or Firm*—Harness, Dickey & Pierce, P.L.C.

(57) ABSTRACT

Disclosed is an electric circuit, in particular for a medium voltage power converter. The circuit has at least four semiconductor switches which form a series connection and which are connected to poles of a direct current voltage (Ud). A diode is connected in parallel in an inverse direction to each semiconductor switch. A capacitor is connected in parallel to the two semiconductors in the middle of the series connection. The circuit is provided with a pole of an output potential (Ua) which is connected centrally in the series connection. The circuit has a control device for successively controlling the semiconductor switches. The time interval between the transition of two of the semiconductor switches into their respective controlling states is minimal.

14 Claims, 5 Drawing Sheets

U.S. PATENT DOCUMENTS 6,058,031 A * 5/2000 Lyons et al. ............... 363/132

FOREIGN PATENT DOCUMENTS

| | | |
|---|---|---|
| DE | 198 17 752 A1 | 10/1999 |
| DE | 198 27 872 A1 | 12/1999 |
| DE | 198 47 267 A1 | 4/2000 |
| EP | 0533158 | 3/1993 |
| EP | 0 820 893 A2 | 7/1997 |
| EP | 0 820 893 A3 | 7/1997 |
| EP | 0913918 | 5/1999 |
| EP | 06977348 | 2/2000 |
| WO | WO 9940676 | 8/1999 |

OTHER PUBLICATIONS

Carpita M. et al.; Preliminary Design Of A 18 KV Locomotive; vol. 2, Publication No. XP 000537737; Publication Date Sep. 19, 1995; pp. 2.153-2.158.

Der EuroSprinter; Publication No. XP 0000438165; pp. 50-61, no date.

Mizutani Tadao; Mult-connection Inverter; Publication No. 55120375; Publication Date Sep. 16, 1980.

Yatsuno Tadashi; Rectifier; Publication No. 58179163; Publication Date Apr. 9, 1982.

Carpita M. et al.; Preliminary Design Approach by ATP Simulator of the 18 KV DC Traction System; pp. 2.766-2.771; Sep. 19, 1995.

* cited by examiner

ELECTRIC CIRCUIT, IN PARTICULAR FOR A MEDIUM-VOLTAGE POWER CONVERTER

This application is the national phase under 35 U.S.C. § 371 of PCT International Application No. PCT/EP00/03275 which has an International filing date of Apr. 12, 2000, which designated the United States of America, the entire contents of which are hereby incorporated by reference.

BACKGROUND OF THE INVENTION

1. Field of the Invention

The invention relates to an electric circuit, in particular for a medium-voltage power converter, having at least four semiconductor switches that form a series circuit and are connected to poles of a direct voltage, a diode being connected in antiparallel with each of the semiconductor switches, and a capacitor being connected in parallel with the two middle semiconductor switches of the series circuit, having a pole of an output voltage that is connected in the middle to the series circuit, and having a control unit for sequentially driving the semiconductor switches. The invention likewise relates to a corresponding method for operating an electric circuit, in particular for a medium-voltage power converter.

2. Related Art

Such an electric circuit is generally known and is used, in particular, in medium-voltage power converters. The direct voltage is connected to the outer two taps of the semiconductor switches forming a series circuit, and the output voltage is present at their common, middle tap. The semiconductor switches are switched by a control unit one after another into their conducting and their blocking states. The resulting AC voltage includes of a sequence of pulses.

Asymmetric voltage splits between the various semiconductor switches can occur because of the ever present differences between the performance quantities of the semiconductor switches connected in series, and this can lead to overloadings of the individual semiconductor switches. Likewise, as a consequence of switching over the semiconductor switches the voltage jump of the individual pulses of the output voltage is very large, and this can lead to overvoltage peaks. These disadvantages are removed or at least lessened in the case of known power converters with substantial outlay on circuitry.

SUMMARY OF THE INVENTION

It is an object of the invention to create an electric circuit and a method of the type mentioned at the beginning hereof which generate low overvoltage peaks buth without requiring a special outlay.

According to the present invention, the object is achieved in the case of an electric circuit of the type mentioned at the beginning hereof by virtue of the fact that a time period between a transition of two semiconductor switches into a respectively conducting state is very short. The object is achieved correspondingly in the case of a method of the type mentioned at the beginning hereof.

It is possible with the aid of the circuit according to the present invention to design individual pulses of an output voltage in a stair-step fashion. The result is thus a stair-stepped variation in the edges of the output voltage, in particular. This means at the same time that only a portion of the total direct voltage is switched at one and the same instant in the case of the output voltage. The voltage jumps of the individual stair steps of the output voltage are therefore smaller than in the case of the known circuit. This leads to lower overvoltage peaks and rates of rise of voltage in the case of the output voltage.

The outlay required by the present invention on circuitry is limited substantially by comparison with the known art to a different drive of the semiconductor switches.

In an advantageous embodiment of the present invention, the time period between the transition of two semiconductor switches is selected as a function of the switching time of one of the semiconductor switches and/or the resonant frequency of the load, if appropriate including the cables present. The time period between the transition of two semiconductor switches is preferably between approximately 0.01 microseconds and approximately 10 microseconds, preferably approximately 2 microseconds. A reduction is thereby achieved in the resulting rate of voltage rise and in the overvoltage peaks at the load.

The time period between two successive stair steps of the output voltage is fixed in this way. Such a short time interval between the stair steps according to the present invention is attended by the substantial advantage that because of the short time interval the capacitors via which a current flows during this interval are loaded only slightly. It is therefore not necessary to provide large capacitors, and so the outlay on circuitry in this regard remains low and can even be reduced by comparison with the known art.

In an advantageous development of the invention, a provision is made of corresponding further semiconductor switches, diodes and capacitors, it being possible for the control unit to control the semiconductor switches of the series circuit into the conducting state one after another. The individual pulses of the output voltage can thereby be designed as finely as desired in terms of the stair steps. At the same time, overvoltage peaks can be further reduced because voltage jumps become ever smaller.

It is particularly advantageous if the capacitance of the capacitor or the capacitors is very small. As already mentioned, this further reduces the outlay on implementing the output voltage of fine stair steps according to the present invention.

In an advantageous refinement of the present invention, the time period between the transition of two neighboring semiconductor switches into the respectively conducting state is a long one, in particular between approximately 100 microseconds and approximately 500 microseconds, preferably approximately 250 microseconds.

In pictorial terms, this long time period generates an offset in the stair-step output voltage. This offset entails the advantage that current harmonics which would arise per se at the usual operating frequencies of the semiconductor switches from approximately 500 Hz to approximately 1000 Hz are strongly damped or reduced to a lesser extent. The diminished current harmonics are achieved in this case in essence only by driving the semiconductor switches appropriately, and so to this extent there is no need for special outlay on circuitry.

The present invention also includes a method for operating an electric circuit in particular for a medium-voltage power converter, the circuit being provided with a plurality of semiconductor switches that form a series circuit and are connected to poles of a direct voltage, a diode being connected in antiparallel to each of the semiconductor switches, a capacitor being connected in parallel in each case starting from the two middle semiconductor switches, the circuit being provided with a pole of an output voltage that is connected in the middle to the series circuit, the semiconductor switches being controlled into their conducting state one after another, and the time period between the transition of two semiconductor switches into the respectively conducting state being very short.

The stair-step course of the output voltage already described is generated with the aid of the abovementioned method according to the present invention. As likewise already mentioned, this essentially requires only one appropriate drive of the semiconductor switches, in which case it is possible to generate either quickly successive stair steps or offsets that are spaced further apart, depending on the time intervals between these drives.

Further features, possible applications and advantages of the present invention emerge from the following description of exemplary embodiments of the invention, which are illustrated in the figures of the drawing. Here, all the features described or illustrated form the subject matter of the present invention per se or in any desired combination, independently of their combination in the patent claims or their back referral and independently of their formulation and/or representation in the description and/or in the drawing.

DETAILED DESCRIPTION OF THE PREFERRED EMBODIMENTS

Figure 1:
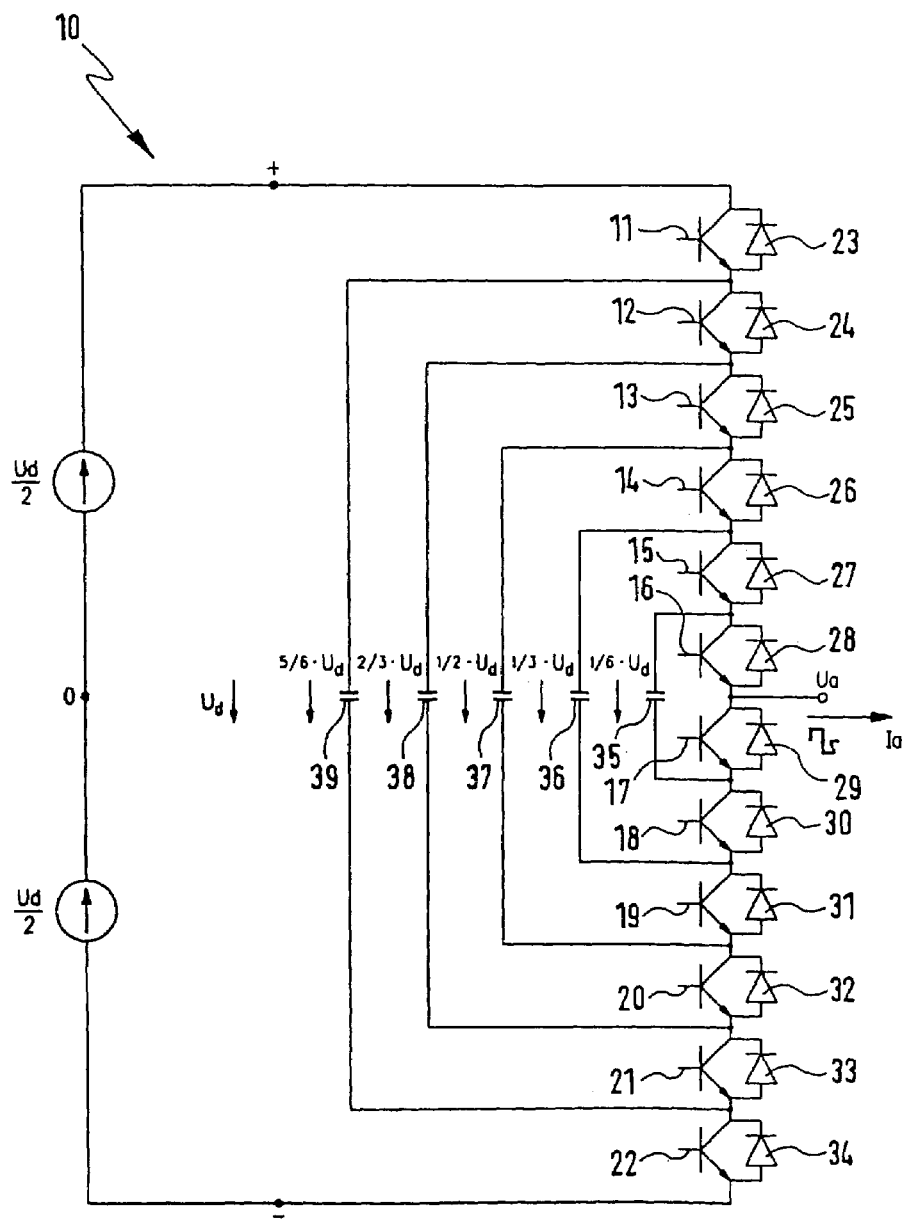
FIG. 1 illustrates a schematic circuit diagram of a first exemplary embodiment of an electric circuit according to the present invention.

Illustrated in FIG. 1 is an electric circuit 10 that may be used, in particular, in a medium-voltage power converter and with which, for example, an electric motor is fed as a load.

The direct voltage Ud that is polarized according to the data in FIG. 1 is applied on the input side to the circuit 10. The direct voltage Ud can be in a range from approximately 1 kV to approximately 100 kV, preferably at approximately 16 kV. The circuit 10 transforms the direct voltage Ud into an AC voltage Ua that includes a sequence of pulses.

Three such circuits 10 with the aid of which one phase of a three-phase AC voltage is generated in each case are normally present in a medium-voltage power converter.

Twelve semiconductor switches 11 to 22 are connected in series in the circuit 10 between the positive pole and the negative pole of the direct voltage Ud. The semiconductor switches 11 to 22 are driven by a control unit that is not illustrated in FIG. 1.

A diode 23 to 34 is connected in antiparallel to each of the semiconductor switches 11 to 22.

A capacitor 35 is connected to the associated diodes 28, 29 in parallel with the two semiconductor switches 16, 17. A capacitor 36 is connected to the associated diodes 27 to 30 in parallel with the four semiconductor switches 15 to 18. A capacitor 37 is connected to the associated diodes 26 to 31 in parallel with the six semiconductor switches 14 to 19. A capacitor 38 is connected to the associated diodes 25 to 32 in parallel with the eight semiconductor switches 13 to 20. Finally, a capacitor 39 is connected to the associated diodes 24 to 33 in parallel with the ten semiconductor switches 12 to 21.

As specified in FIG. 1, it is assumed that the capacitors 35 to 39 are charged to the following voltages: the capacitor 35 is charged to ⅙ of the direct voltage Ud, the capacitor 36 is charged to ⅓ of the direct voltage Ud, the capacitor 37 is charged to ½ of the direct voltage Ud, the capacitor 38 is charged to ⅔ of the direct voltage Ud, and, finally, the capacitor 39 is charged to ⅚ of the direct voltage Ud. This charging of the capacitors 35 to 39 is achieved by appropriate measures in terms of circuitry.

Figure 2:
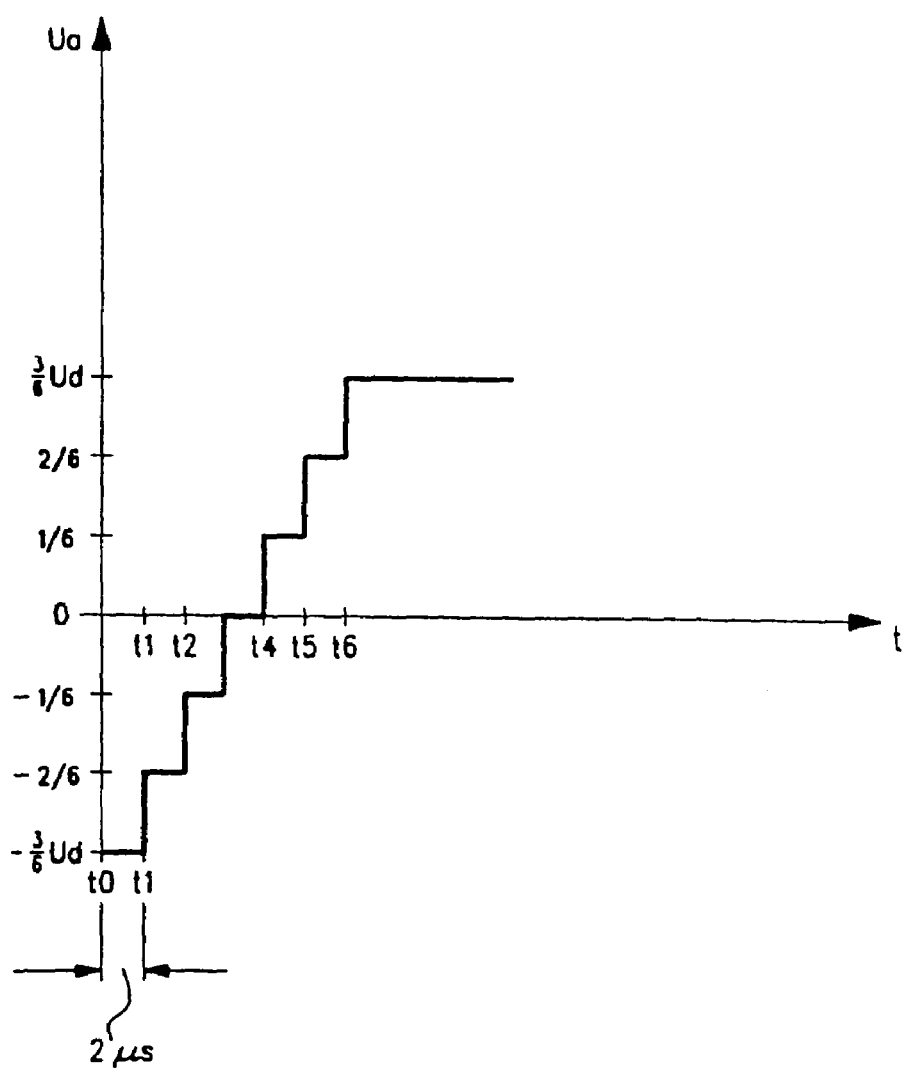
FIG. 2 illustrates a schematic timing diagram of the output voltage of the circuit of FIG. 1.

A timing diagram of a pulse of the AC voltage Ua is illustrated against time t in FIG. 2. It is assumed that at an instant t0 all the semiconductor switches 11 to 16 are blocked, and all the semiconductor switches 17 to 22 are conducting. It is also assumed that the output voltage Ua is equal to −3/6 Ud at the instant t0, and an output current Ia flows to the load via the diodes 29 to 34. It is likewise assumed that complementary semiconductor switches are always switched, that is to say, for example, the semiconductor switch 11 is blocked and then the semiconductor switch 22 is switched to be conducting, or the semiconductor switch 11 is switched to be conducting and then the semiconductor switch 22 is blocked.

When at the instant t1, for example, the semiconductor switch 11 is controlled to be conducting and the semiconductor switch 22 is blocked, and the semiconductor switches 12 to 16 remain blocked while the semiconductor switches 17 to 21 remain conducting, a current flows from the positive pole of the direct voltage Ud via the semiconductor switch 11, via the capacitor 39 and via the diodes 33, 32, 31, 30 and 29 to the pole of the output voltage Ua.

It is sensible to start with driving the semiconductor switch 11 when the capacitor 39 has a voltage lower than ⅚ Ud and the absolute value of the deviation is the largest of all the capacitors, since this capacitor 39 is charged when the semiconductor switch 11 is closed. It is possible in this way to control the symmetry of the capacitor voltages via the sequence of driving the semiconductor switches and via the time delay.

Because of the capacitor 39 charged to ⅚ of the direct voltage Ud, only −2/6 Ud of the direct voltage −3/6 Ud still remain as output voltage Ua at this instant t1. This is illustrated in FIG. 2 by the corresponding stair step at the instant t1.

After the instant t1, the abovementioned current would charge the capacitor 39 from ⅚ to the total direct voltage Ud. Before this is the case, however, at an instant t2 the semiconductor switch 21 is also blocked in addition to the blocked semiconductor switch 22, and the next semiconductor switch 12 is also controlled to be conducting in addition to the closed semiconductor switch 11, the other semiconductor switches 13 to 16 remaining blocked, and the semiconductor switches 17 to 20 remaining conducting. The consequence of this is that a current flows from the positive pole of the direct voltage ⅚ Ud via the semiconductor switches 11 and 12, via the capacitor 38 and via the diodes 32, 31, 30 and 29 to the pole of the output voltage Ua.

Because of the capacitor 38 charged to ⅔ of the direct voltage Ud, only −⅙ Ud of the total direct voltage Ud present still remain as output voltage Ua at this instant t2. This is illustrated in FIG. 2 by the corresponding further stair step at the instant t2.

This method is continued until the semiconductor switches 11 to 16 are controlled to be conducting and the semiconductor switches 17 to 22 are blocked, and thus the positive pole of the direct voltage ⅙ Ud is connected directly to the pole of the output voltage Ua via the semiconductor switches 11 to 16. This then effects in FIG. 2 at an instant t6 a last stair step to the total direct voltage ⅚ Ud. The total direct voltage ⅚ Ud is therefore present as output voltage Ua at the instant t6.

Overall, the output voltage Ua has therefore risen from a first level, specifically −Ud/2, in six stair steps to a second level, specifically the direct voltage Ud/2.

Thereafter, the semiconductor switches 11 to 16 are controlled again into their blocked state, and the semiconductor switches 17 to 22 are controlled again into their conducting state. The consequence of this is that the output voltage Ua goes back again to Ud/2 in a stair-step fashion. The stair steps correspond in this case in the reverse direction to the stair steps shown in FIG. 2.

Overall, a pulse has thereby been generated in the output voltage Ua of the circuit 10. In this case, the switch-on edge and the switch-off edge of this pulse are of stair-step design.

The sequence of the driving of the semiconductor switches 11 to 22 in FIG. 1 is designed, insofar as it relates to the generation of positive and negative edges, as a function of the charge state of the associated capacitors 35 to 39. Here, this sequence has no influence on the stair-step shape of the voltage generated.

Overall, the above-described driving of the semiconductor switches 11 to 22 from the direct voltage Ud on the input side can be used to generate the output voltage Ua in the shape of pulses, the switch-on and switch-off edges of these pulses respectively being of stair-step design.

The time interval between the individual instants at which the semiconductor switches 11 to 22 are reversed one after another is very short. In particular, this time interval is selected as a function of the switching time of the semiconductor switches 11 to 22 used and/or of the resonant frequency of the load, if appropriate including the cables present. In particular, this time interval can be selected such that the overvoltage peaks at the load are minimized. For example, the time interval is in a range between approximately 0.01 microseconds and approximately 10 microseconds. As is also specified in FIG. 2, this period is preferably 2 microseconds.

The capacitances of the capacitors 35 to 39 can be selected to be relatively small on the basis of the existing time intervals between the individual instants at which the semiconductor switches 11 to 22 are reversed one after another. They can be calculated in this case using the following equation:

$$C = (I \times \text{delta } t)/\text{delta } U \quad \text{a}$$

Here, C is the capacitance to be calculated, I is the charging current through the respective capacitor, delta t is the time interval between the individual instants at which the semiconductor switches 11 to 22 are reversed one after another, for example 2 microseconds, and delta U is approximately 10% of the nominal voltage of the associated capacitor.

The sequence of the driving of the individual series-connected semiconductor switches of a half group should preferably be determined by which capacitors have the voltage deviating most from their nominal value. It is possible in this way respectively to introduce a current flow through the capacitors that recharges the capacitors such that the asymmetric voltage is counteracted.

In each of the previously described stair steps, only ⅙, that is to say approximately 17%, of the total direct voltage Ud is passed on to the output voltage Ua. The result of this is that possible overvoltage peaks, for example, in a downstream electric motor, are caused only by these stair steps. The electric motor need therefore not be designed for overvoltage peaks that would occur upon the switching of the total direct voltage Ud.

Figure 3:
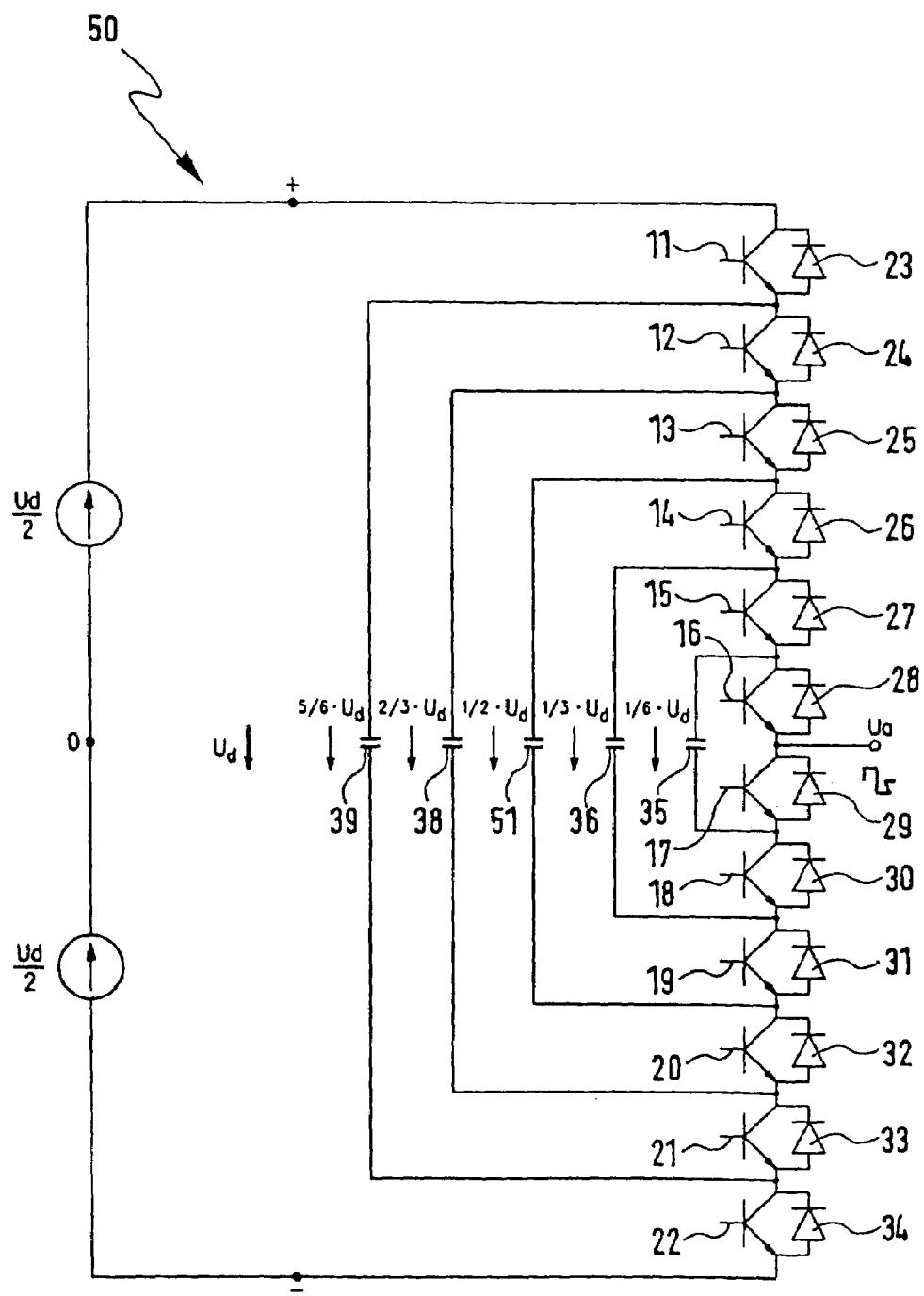
FIG. 3 illustrates a schematic circuit diagram of a second exemplary embodiment of an electric circuit according to the present invention.
Figure 4:
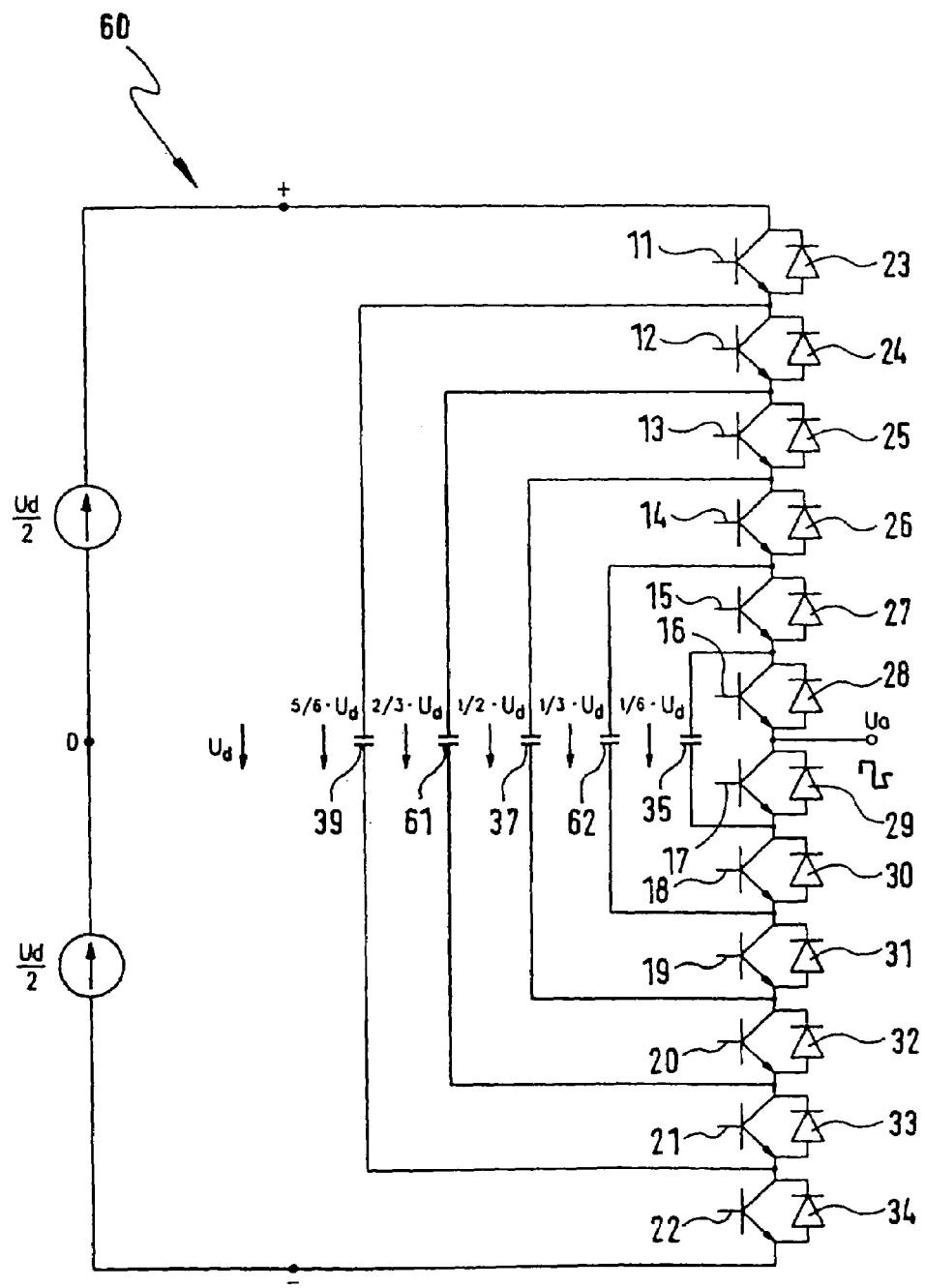
FIG. 4 illustrates a schematic circuit diagram of a third exemplary embodiment of an electric circuit according to the present invention.

FIGS. 3 and 4 illustrate electric circuits 50 and 60 that largely correspond to the electric circuit 10 of FIG. 1. Identical components are therefore marked with identical reference numerals.

Figure 5:
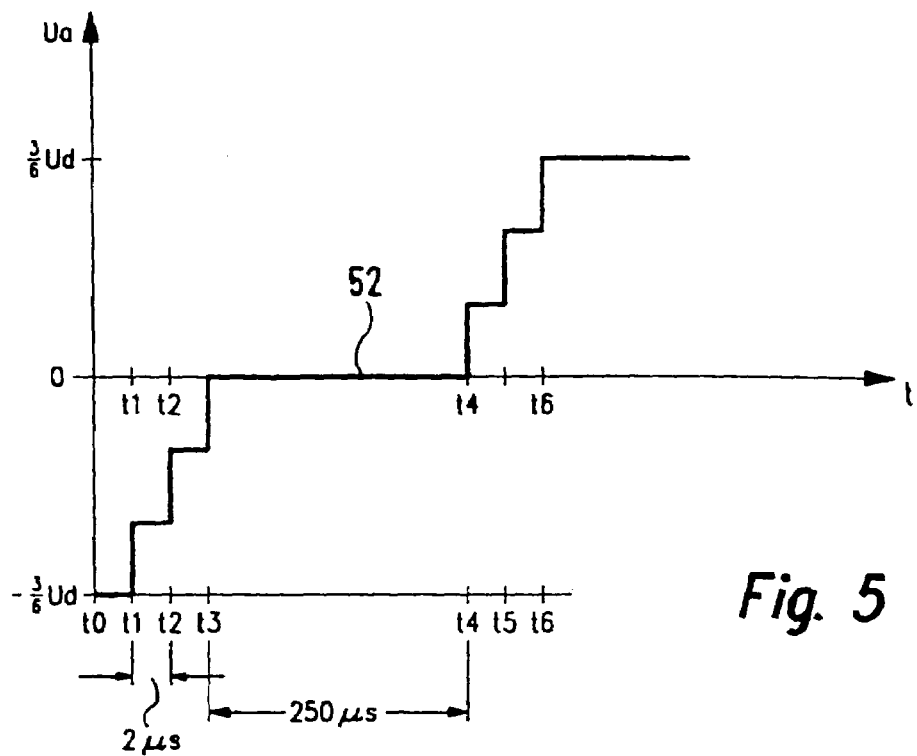
FIG. 5 illustrates a schematic timing diagram of the output voltage of the circuit of FIG. 3.
Figure 6:
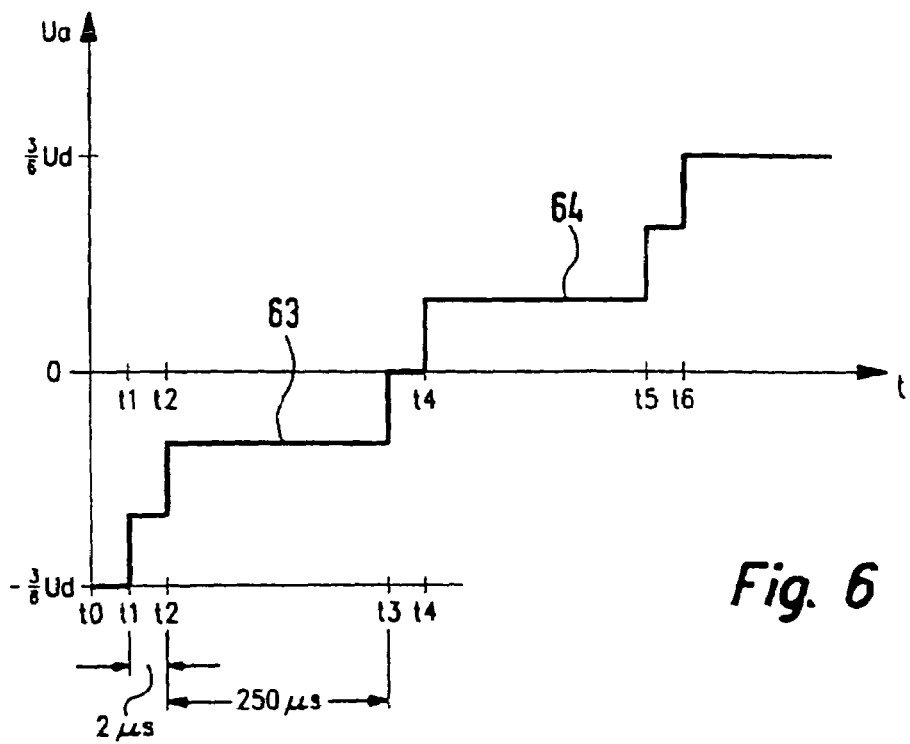
FIG. 6 shows a schematic timing diagram of the output voltage of the circuit of FIG. 4.

The timing diagram of FIG. 5 belongs to the circuit 50 of FIG. 3, and the timing diagram of FIG. 6 belongs to the circuit 60 of FIG. 4. The timing diagrams of FIGS. 5 and 6 are similar to the timing diagram of FIG. 2. Identical features are therefore provided with identical designations.

As a difference from the circuit 10 of FIG. 1, in the circuit 50 of FIG. 3 a larger capacitor 51 is provided instead of the capacitor 37. Moreover, in accordance with the timing diagram of FIG. 5 a longer time interval is provided between the instants t3 and t4 than in the case of the timing diagram of FIG. 2.

In the case of FIG. 5, the time interval between, for example, the instants t1 and t2 is 2 microseconds, for example, as before. The time interval between the instants t3 and t4 is, however, greater by a factor of approximately 100. This time interval is, for example, in a range from approximately 100 microseconds to approximately 1000 microseconds. The time interval is preferably approximately 250 microseconds, as is also specified in FIG. 5.

The result of this is that the stair steps already known from FIG. 2 are likewise present at the instants t1 and t2 in FIG. 5. However, because of the longer time interval, an offset 52 is present in FIG. 5 between the instants t3 and t4.

During this offset 52, a current flows from the positive pole of the direct voltage Ud via the semiconductor switches 11, 12 and 13, via the capacitor 51 and via the diodes 31, 30 and 29 to the pole of the output voltage Ua. Because of the longer time interval between the instants t3 and t4, this current flows longer than between, for example, the instants t1 and t2. This current flowing for a longer time interval imposes a higher load on the capacitor 51 of FIG. 3 than the capacitor 37 of FIG. 1. For this reason, the capacitance of the capacitor 51 is selected to be larger than the capacitance of the capacitor 37. It can, in turn, be calculated with the aid of the equation already specified, the larger value of the capacitance resulting from the larger delta t.

The output voltage Ua therefore rises in the case of the circuit 50 from the first level, specifically −Ud/2, via three stair steps to a second level, specifically the offset 52, and from there in a further three stair steps to a third level, specifically to the direct voltage Ud/2.

When the circuit 50 of FIG. 3 is used in a medium-voltage power converter, the semiconductor switches 11 to 22, for example appropriate IGBTs, can usually be operated with an operating frequency from approximately 500 Hz to approximately 1000 Hz. In the case of two-stage inverters, the consequence of these operating frequencies is current harmonics in the output-side current of the AC voltage that are not insubstantial.

In accordance with FIG. 5, the intermediate circuit voltage is switched from positive to negative with a longer offset 52, and this leads to a reduction in the voltage harmonics. In the case of the circuit 50 of FIG. 3 with the associated offset 52 according to FIG. 5, the output-side current therefore has smaller current harmonics than in the case of the circuit 10 of FIG. 1.

As a difference from the circuit 10 of FIG. 1, in the circuit 60 of FIG. 4 two larger capacitors 61 and 62 are provided instead of the capacitors 38 and 36. The capacitance of the capacitors 61, 62 corresponds approximately to the capacitance of the capacitor 51 of FIG. 3.

Furthermore, in accordance with FIG. 6 a longer time interval is provided in each case between the instants t2 and t3 and between the instants t4 and t5 than in the case of FIG. 2. This longer time interval corresponds approximately to that of FIG. 5.

The consequence of this is that two offsets 63 and 64 are present in accordance with FIG. 6, which is associated with the circuit 60.

The output voltage Ua therefore rises in the case of the circuit 60 from the first level, specifically –Ud/2, via two stair steps to a second level, specifically the offset 63, from there in a further two stair steps to a third level, specifically the offset 64, and from there in a further two stair steps to a fourth level, specifically to the direct voltage Ud/2.

In the case of the circuit 60 of FIG. 4 with the associated offsets 63 and 64 according to FIG. 6, the output-side current of the AC voltage therefore has still smaller current harmonics than in the case of the circuit 50 of FIG. 3.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. An electric circuit for a medium-voltage power converter, comprising:
   at least four semiconductor switches that form a series circuit and are connected to poles of a direct voltage;
   a diode being connected in antiparallel with each of the semiconductor switches; and
   a capacitor being connected in parallel with two middle semiconductor switches of the semiconductor switches of the series circuit,
   wherein a pole of an output voltage is connected to the middle of the series circuit, and a control unit is provided for sequentially driving the semiconductor switches, wherein a time period between a transition of two semiconductor switches into a respectively conducting state is very short, wherein the time period between the transition of two semiconductor switches is between approximately 0.01 microseconds and approximately 10 microseconds.

2. The circuit as claimed in claim 1, wherein the time period between the transition of two semiconductor switches is selected as a function of a switching time of one of the semiconductor switches.

3. The circuit as claimed in claim 1, wherein by corresponding further semiconductor switches, diodes and capacitors, it is possible for the control unit to control the semiconductor switches of the series circuit into a conducting state one after another.

4. The circuit as claimed in claim 1, wherein the capacitance of the capacitor is very small.

5. The circuit as claimed in claim 1, wherein the time period between the transition of two neighboring semiconductor switches into the respectively conducting state is between approximately 100 microseconds and approximately 1000 microseconds.

6. The circuit as claimed in claim 1, wherein the time period between the transition of two semiconductor switches is selected as a function of a resonant frequency of a load.

7. The circuit as claimed in claim 1, wherein the time period between the transition of two semiconductor switches is approximately 2 microseconds.

8. The circuit as claimed in claim 1, wherein the time period between the transition of two neighboring semiconductor switches into the respectively conducting state is approximately 250 microseconds.

9. A method for operating an electric circuit, comprising:
   providing a plurality of semiconductor switches that form a series circuit and are connected to poles of a direct voltage,
   providing a diode being connected in antiparallel to each of the semiconductor switches, a capacitor being connected in parallel in each case starting from two middle semiconductor switches,
   wherein the circuit is provided with a pole of an output voltage that is connected in the middle of the series circuit, and wherein the semiconductor switches are controlled into a conducting state one after another, wherein a time period between a transition of two semiconductor switches into a respectively conducting state is very short, wherein the time period between the transition of two semiconductor switches is between approximately 0.01 microseconds and approximately 10 microseconds.

10. The method as claimed in claim 9, wherein the time period between the transition of two semiconductor switches is selected as a function of a switching time of one of the semiconductor switches.

11. The method as claimed in claim 9, wherein the time period between the transition of two neighboring semiconductor switches into the respectively conducting state is between approximately 100 microseconds and approximately 1000 microseconds.

12. The method as claimed in claim 9, wherein a sequence of driving the semiconductor switches is carried out as a function of a charge state of the capacitor.

13. The method as claimed in claim 9, wherein the time period between the transition of two semiconductor switches is selected as a function of a resonant frequency of a load.

14. The method as claimed in claim 9, wherein the time period between the transition of two neighboring semiconductor switches into the respectively conducting state is approximately 250 microseconds.

* * * * *